(12) United States Patent
Mai

(10) Patent No.: US 9,172,327 B2
(45) Date of Patent: Oct. 27, 2015

(54) CRYSTAL OSCILLATOR CIRCUIT HAVING LOW POWER CONSUMPTION, LOW JITTER AND WIDE OPERATING RANGE

(71) Applicant: CAPITAL MICROELECTRONICS CO., LTD., Beijing (CN)

(72) Inventor: Rifeng Mai, Beijing (CN)

(73) Assignee: CAPITAL MICROELECTRONICS CO., LTD., Beijing (CN)

( * ) Notice: Subject to any disclaimer, the term of this patent is extended or adjusted under 35 U.S.C. 154(b) by 0 days.

(21) Appl. No.: 14/081,044

(22) Filed: Nov. 15, 2013

(65) Prior Publication Data

US 2015/0061786 A1 Mar. 5, 2015

(30) Foreign Application Priority Data

Aug. 29, 2013 (CN) .......................... 2013 1 0383027

(51) Int. Cl.
*H03B 5/36* (2006.01)
(52) U.S. Cl.
CPC ........ *H03B 5/364* (2013.01); *H03B 2200/0094* (2013.01)
(58) Field of Classification Search
CPC ....................................... H03B 5/364
USPC .............................................. 331/116 FE, 158
See application file for complete search history.

(56) References Cited

U.S. PATENT DOCUMENTS

| 6,774,735 B2* | 8/2004 | Senthilkumar et al. | 331/158 |
| 7,123,113 B1* | 10/2006 | Brennan et al. | 331/158 |
| 8,816,790 B2* | 8/2014 | Sinoussi | 331/185 |

* cited by examiner

*Primary Examiner* — Joseph Chang
(74) *Attorney, Agent, or Firm* — Buchanan Ingersoll & Rooney PC

(57) ABSTRACT

A crystal oscillator circuit includes: a crystal resonator circuit, generating an oscillation signal; an inverting amplification circuit, whose amplifier input end is coupled to receive the oscillation signal, in which an inverting amplifier outputs an inverting amplified output signal; a bias circuit, having a bias circuit input end and a bias circuit output end, in which the bias circuit output end generates a bias circuit output signal controlled by the bias circuit input end, and the bias circuit output signal is coupled to a second control end of the inverting amplification circuit; and a peak detection circuit, comparing the inverting amplified output signal with a reference signal, regulating a peak detector output signal, and feeding the peak detector output signal into the bias circuit input end.

11 Claims, 5 Drawing Sheets

CRYSTAL OSCILLATOR CIRCUIT HAVING LOW POWER CONSUMPTION, LOW JITTER AND WIDE OPERATING RANGE

BACKGROUND

1. Technical Field

The present invention relates to a crystal oscillator, and in particular, to an amplitude controlled crystal oscillator having a peak detector, to adapt to a wider dynamic frequency range and a wider crystal indicator range.

2. Related Art

The oscillator is a component critical to the performance of modern electronic devices. Digital timepieces, computers, cameras, televisions, mobile phones, tablet computers, communications devices and the like all use a crystal oscillator to generate a desired clock signal.

FIG. 1 illustrates a conventional crystal oscillator circuit. The oscillator circuit includes an inverting amplifier consisting of a PMOS transistor M2, a resistor R13 and an NMOS transistor M1 and a feedback network consisting of, for example, a quartz crystal, a capacitor Cp and a resistor Re. The feedback network outputs a feedback signal to an input end of the inverting amplifier, thereby forming a closed loop feedback system.

FIG. 2 illustrates an oscillator circuit having a peak detector. The oscillator circuit includes a peak detector, for comparing a peak of an output signal of an oscillator and a reference voltage. When the oscillator circuit starts, amplitude of the output signal of the oscillator is lower, the peak detector outputs a higher voltage signal, and the voltage signal conducts the transistor M12, and applies a greater bias current to the inverting amplifier through a current mirror circuit consisting of M11 and M3, to facilitate the work of the oscillator. When the oscillator circuit is more stable, the peak detector detects a higher oscillator output voltage signal, thereby applying a smaller bias current, so that the stabilized oscillator output voltage is maintained at a lower level. The circuit has advantages of quickly starting and avoiding excessive consumption of energy after stabilization. However, the circuit has disadvantages of large noise and large jitter.

SUMMARY

The present invention provides a crystal oscillator circuit, including: a crystal resonator circuit, generating an oscillation signal having a predetermined oscillation frequency; an inverting amplifier, having a amplifier input end, a second control end and an inverting amplifier output end, the amplifier input end being coupled to an oscillator and receiving the oscillation signal, in which the inverting amplifier outputs an inverting amplified output signal; a bias circuit, having a bias circuit input end and a bias circuit output end, in which the bias circuit output end generates a bias circuit output signal controlled by the bias circuit input end, and the bias circuit output signal is coupled to the second control end of the inverting amplification circuit; and a peak detector, comparing the inverting amplified output signal with a reference signal, regulating a peak detector output signal, and feeding the peak detector output signal into the bias circuit input end.

Preferably, the peak detector includes a low pass filter consisting of a first resistor and a first capacitor.

Preferably, the inverting amplifier circuit includes a first NMOS transistor, a second PMOS transistor and a second resistor, in which a gate of the first NMOS transistor, a gate of the second PMOS transistor and one end of the second resistor are connected to an input end of the inverting amplifier circuit, a drain of the first NMOS transistor and a source of the second PMOS transistor are connected with the other end of the second resistor, and a drain of the second PMOS transistor is connected to the second control end of the inverting amplifier; and a source of the first NMOS transistor is grounded.

Preferably, the second resistor consists of an NMOS transistor, the gate of the NMOS transistor forms a first control end of the inverting amplification circuit.

Preferably, the bias circuit includes a twelfth NMOS transistor, a first current source and a second current source, a gate of the twelfth NMOS transistor is connected to the bias circuit input end, a drain of the twelfth NMOS transistor is connected to a first branch of the first current source, a second branch of the first current source is connected to a first branch of the second current source, and a second branch of the second current source is connected to the bias circuit output end.

Preferably, the first current source and/or the second current source consists of a transistor.

Preferably, the first branch of the second current source is a mirror image of a second branch of a second current mirror, thereby forming a self-adjusting circuit for isolating a power supply from a second input end of the inverting amplifier.

Preferably, the bias circuit includes a narrow-band filter connected between the bias circuit input end and the bias circuit output end, for performing low pass filtering at a first frequency lower than an oscillator oscillation frequency; the bias circuit further includes a frequency detector, for bypassing a switched capacitor filter when the oscillator frequency is not stable. Preferably, the narrow-band filter is a switched capacitor filter. Further preferably, the crystal oscillator circuit includes a low pass filter consisting of a third resistor and a third capacitor.

Preferably, the crystal oscillator circuit includes a frequency divider, generating the first frequency lower than the oscillator oscillation frequency.

In the above embodiments, the self-adjuster isolates the power supply noise, and thus the crystal oscillator circuit has a very good ability to suppress the power supply noise.

DETAILED DESCRIPTION

The technical solution of the present invention is further described below in detail with reference to the accompanying drawings and embodiments.

Figure 1:
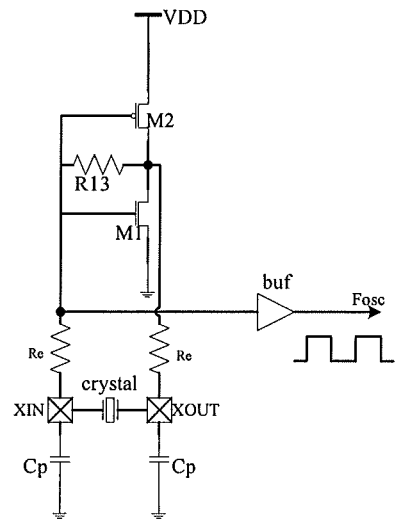
FIG. 1 illustrates a conventional crystal oscillator circuit.
Figure 2:
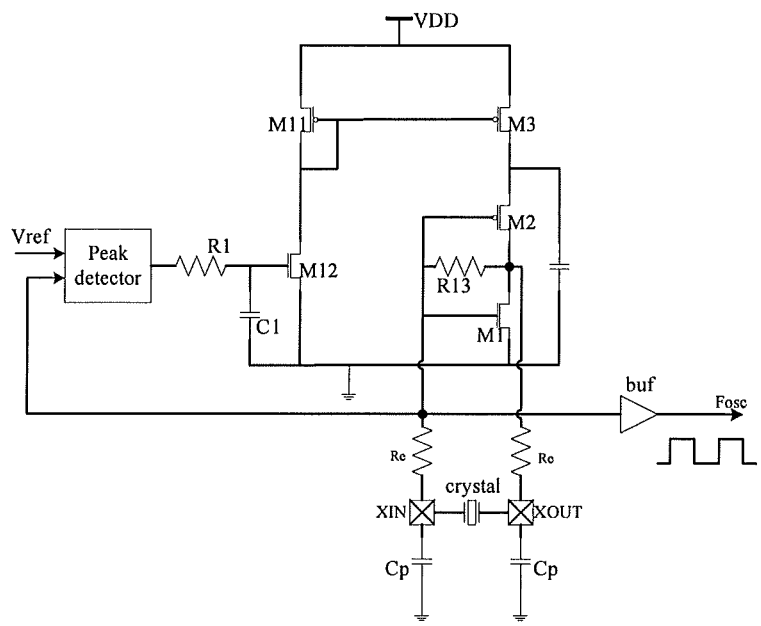
FIG. 2 illustrates an oscillator circuit having a peak detector.
Figure 3:
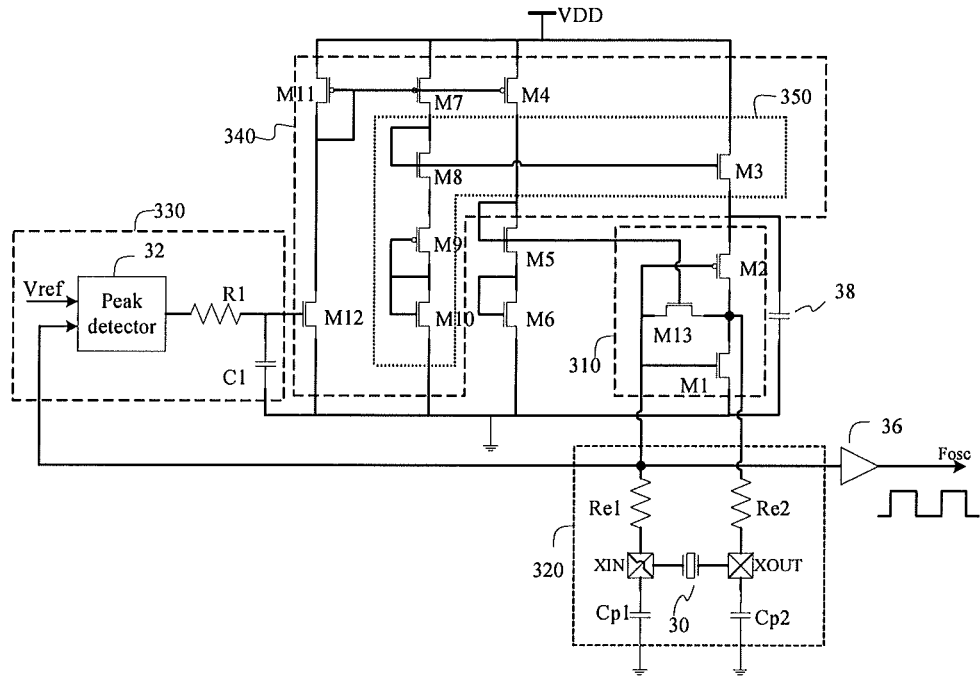
FIG. 3 illustrates a crystal oscillator circuit according to an embodiment of the present invention.

FIG. 3 illustrates a crystal oscillator circuit according to an embodiment of the present invention. As shown in FIG. 3, the crystal oscillator circuit includes an inverting amplification circuit 310, a crystal resonator circuit 320, a peak detection circuit 330, and a bias circuit 340. The bias circuit further includes a self-adjusting circuit 350.

The inverting amplification circuit 310 includes a PMOS transistor M2, an NMOS transistor M1 and an NMOS transistor M13. A drain of M1, a source of M2, and a drain of M13 are connected together, to form an output end of the inverting amplification circuit 310, for outputting an inverting amplified output signal; a gate of M1, a gate of M2, and a source of M13 are connected together, to form an input end of the inverting amplification circuit 310, for receiving an oscillation signal; the gate of M13 forms a first control end of the inverting amplification circuit 310; a drain of M2 forms a second control end of the inverting amplification circuit 310, for receiving an output bias current of the bias circuit 340. Certainly, persons skilled in the art will realize that, the structure of the inverting amplification circuit 310 is only exemplary, and other alternative inverting amplification circuits also can be used, as long as they do not depart from the spirit and scope of the present invention. For example, M13 can be replaced with a resistor having a specified resistance; and for another example, M1 and M2 can be replaced with a transistor.

The crystal resonator circuit 320 includes a crystal 30, and various types of crystals can be used. One end of the crystal 30 is connected to the input end of the inverting amplification circuit 310 through a resistor Re1, and the other end is connected to the output end of the inverting amplification circuit 310 through a resistor Re2 having a resistance equivalent to that of the resistor Re1. A capacitor Cp1 and a capacitor Cp2 are respectively connected between two ends of the crystal 30 and the ground. The crystal resonator circuit generates an oscillation signal having a predetermined oscillation frequency.

The peak detection circuit 330 compares an input voltage and a reference voltage Vref of the oscillator circuit, and a signal after comparison is sent to the bias circuit 340. In an example, the peak detection circuit 330 includes a low pass filter consisting of a resistor R1 and C1, the value of C1 is generally at a magnitude being several pFs, and the value of R1 is generally at a magnitude ranging from several K ohms to dozens of K ohms. The low pass filter filters out high frequency portions in the signal after comparison.

The bias circuit 340 includes an NMOS transistor M12, a gate of M12 functions as a bias circuit input end, to receive the signal after comparison output by the peak detector 320; under the control of the signal, M12 outputs at the drain a current signal with an amplitude corresponding to the signal after comparison. The bias circuit 340 further includes a first current mirror consisting of PMOS transistors M11 and M7, and a branch of the first current mirror where M11 is located is connected to a drain of M12. A current of the branch of the first current mirror where M11 is located is replicated to a branch where M7 is located with the same current or at a equal ratio. The bias circuit 340 further includes a second current mirror consisting of an NMOS transistor M8 and an NMOS transistor M3, a source and a drain of the transistor M8 are connected to the branch where M7 is located, a drain of M3 is connected to a power supply VDD and a source thereof is connected to the second control end of the inverting amplifier (in this example, the drain of M2). Thus, the bias circuit 340 converts the signal after comparison from the peak detector 330 into a bias current, to be injected to the second control end of the inverting amplifier 310.

The self-adjusting circuit 350 includes NMOS transistors M8 and M3 as well as M10 and a PMOS transistor M9. M8 and M3 form a current mirror. The NMOS transistors M9 and M10 are located on a branch, where M8 is located, on the current mirror, and are replicated respectively from the NMOS transistors M1 and M2 located on another branch, so that source direct current voltages of M8 and M3 remain equal, less susceptible to interference from voltage fluctuation of the power supply. Certainly, persons skilled in the art will realize that, the number and type of transistors of the two branches of the second current mirror can be varied, and a self-adjusting circuit can be formed as long as it can be ensured that the source direct current voltages of M8 and M3 remain equal.

In operation, at the beginning, the peak detector 330 injects a current to the second control end of the inverting amplifier 310 through the bias circuit 340, and then the crystal oscillator starts to operate. The initial bias current must be large enough so that the gain of the inverting amplifier 310 is sufficient to overcome the loss introduced by the crystal 30. The bias current generated by the bias circuit 340 results in that an inverting amplified oscillation signal is generated at the gate of the transistor M1 (i.e., the output end of the inverting amplifier 310). The peak detector 330 compares the inverting amplified oscillation signal with a reference signal, and with increase of the amplitude of the oscillation signal, the peak detector 330 will urge the bias current of the bias circuit 340 to decrease, and finally stabilize the amplitude of the oscillation signal at a desired level.

In the above embodiment, the self-adjuster isolates the power supply noise, and thus the crystal oscillator circuit has a very good ability to suppress the power supply noise.

The bias circuit 340 may further include a third branch in the first current mirror, and the branch includes a PMOS transistor M4 and NMOS transistors M5 and M6. M5 and M6 play a role of regulating a gate voltage of M13 in the inverting amplifier circuit 310, thereby adjusting the resistance presented by M13.

It should be indicated that, in FIG. 3, M13 functions as a direct current balancing resistor, and its gate voltage is used for achieving a resistance R.

$$R = 1/\beta(Vgs - Vth)$$

Here, $\beta = \mu C_{ox} W/L$, where W/L is the size of M13. It can be seen that, Vgs is relevant to current mirrors M5-M13 and M4-M11, and the current mirrors are controlled by an output current (I0) of the peak detector. The relation between I0 and Vgs conforms to $$Vgs = Vth + \sqrt{\frac{I0}{\beta}}$$

In this way, R will be controlled by I0. The lower $F_{osc}$ is and the lower I0 is, the larger R is; the higher $F_{osc}$ is and the higher I0 is, the smaller R is.

Figure 4:
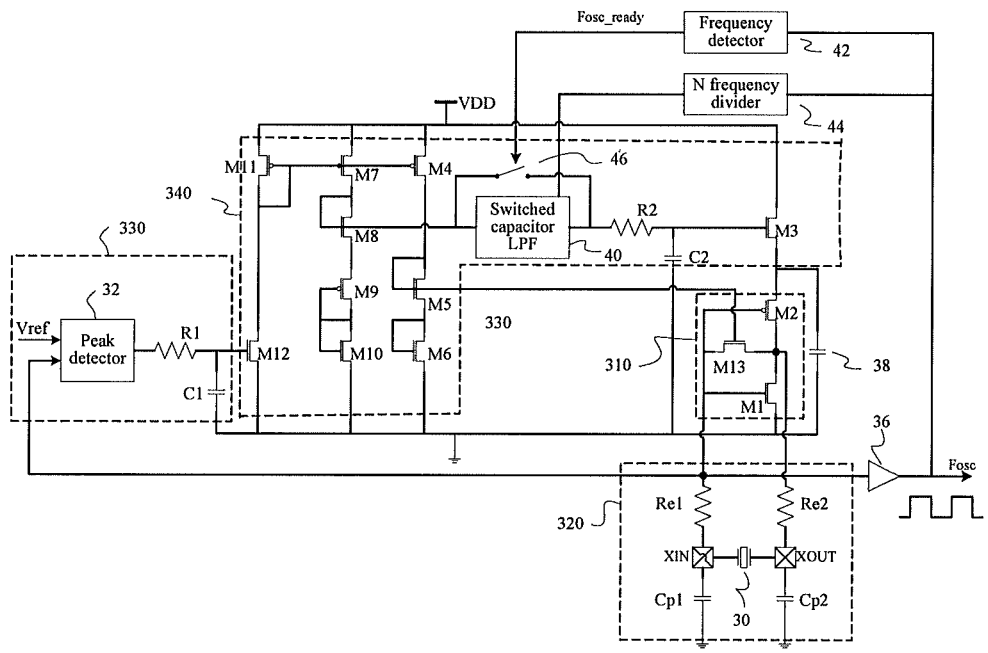
FIG. 4 is a schematic view of a crystal oscillator circuit according to another embodiment of the present invention.

FIG. 4 is a schematic view of a crystal oscillator circuit according to another embodiment of the present invention. A narrow-band filter is added to the crystal oscillator circuit shown in FIG. 4 on the basis of the crystal oscillator circuit in FIG. 3. The filter is located in the bias circuit, including a switched capacitor LPF (low pass filter) 40 between the input end and the output end of the bias circuit, a frequency detector 42 and an N frequency divider 44.

The switched capacitor filter 40 and the resistor R2 are connected in series between gates of M8 and M3. The gate of M3 is grounded through a capacitor C2. The switched capacitor filter 40 alternately turns on and off the capacitor under the control of a switching frequency fc, functioning as a low pass filter, which is equivalent to a resistor with a resistance of $1/fcC_L$, in which $C_L$ is the capacitance of the switched capacitor. The value of C2 is generally at a magnitude being several pFs, and the value of R2 is generally at a magnitude ranging from several K ohms to dozens of K ohms. Therefore, the switched capacitor filter 40, R2 and C2 function as a low pass filter.

The N frequency divider 44 performs N frequency division on an output frequency signal of the crystal oscillator, and the signal after N frequency division serves as the operating frequency of the switched capacitor filter 40.

The frequency detector 42 detects the output frequency signal of the crystal oscillator. When the crystal oscillator enters a stable state, i.e., when a desired frequency signal is detected, the frequency detector 42 outputs an active signal $F_{osc\text{-}ready}$, to open a switch 46, so that a voltage signal from the transistor M8 acts upon the gate of the transistor M3 through the switched capacitor filter 40.

When the oscillator starts, the switched capacitor filter 40 is bypassed. The frequency detector 42 is used for enabling the switched capacitor filter 40 when the oscillator is stable and ready. In such a manner, the double effects of quick starting of the oscillator and low jitter when the oscillator is stable can be achieved.

Figure 5:
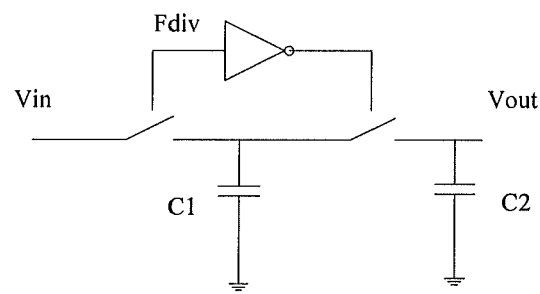
FIG. 5 is a schematic structural view of a switched capacitor filter 40.

FIG. 5 is a schematic structural view of a switched capacitor filter 40. On the assumption that, in the switched capacitor filter 40, the switching frequency of the switch is derived from the N frequency division on $F_{osc}$, i.e., $F_{div}=F_{osc}/N$. On the assumption that the frequency of the input signal Vin is far less than $F_{div}$)

$$\frac{Vout(s)}{Vin(s)} = \frac{1}{1+s\frac{T}{C1}C2}$$

where $T=1/F_{div}$.

The bandwidth of the switched capacitor filter is $f_{3\ dB}=C1/(2*\pi*T*C2)$.

If $C2=1000C1$ and $N=1000$, $f_{3\ dB}=F_{osc}/(1,000,000*2*\pi)$.

In this case, the bandwidth of the switched capacitor filter will be one millionth of $F_{osc}$, which is low enough to filter out almost all noises from Vin.

The narrow-band filter significantly improves the jitter performance, since all the noises from the self-adjuster, the peak detector and the current mirrors are all filtered out, and only the noise of the filter may limit the jitter level of the oscillator.

In an example, in order to facilitate full integration on a chip, the narrow-band filter is achieved by a switched capacitor circuit, of which the clock is derived from a frequency division output of the oscillator circuit. Persons skilled in the art will realize that, other types of narrow-band filters can be used, as long as they do not depart from the scope of the present invention.

Figure 6A:
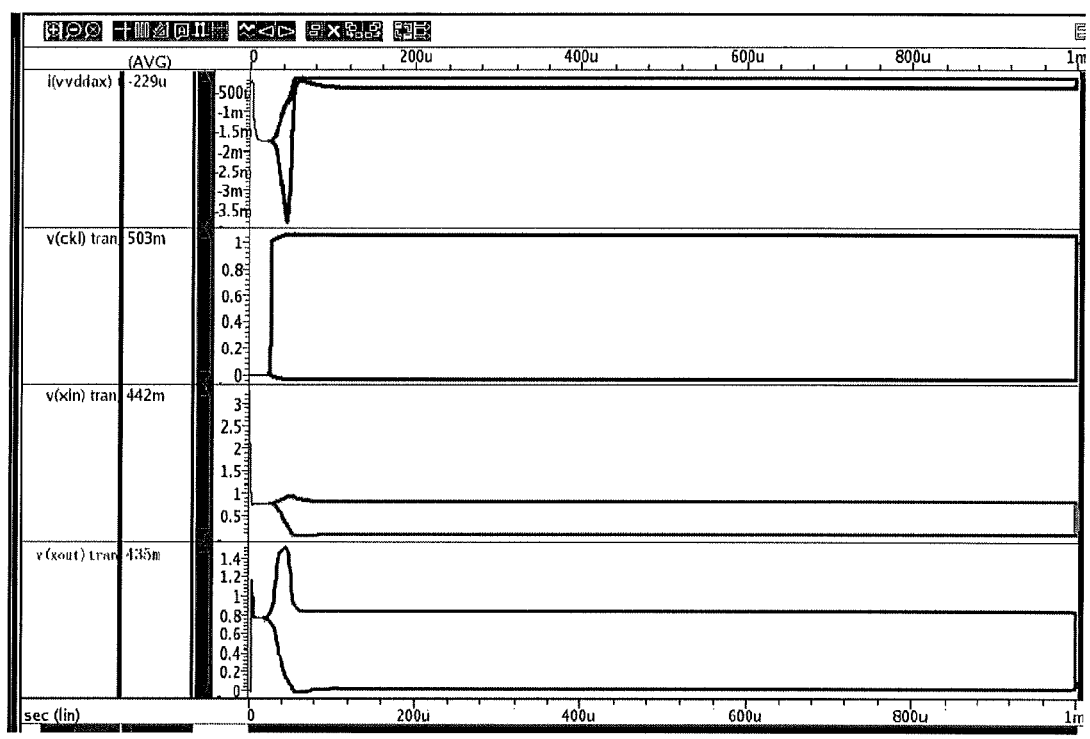
FIG. 6(a) and FIG. 6(b) illustrate simulation results of a crystal oscillator.
Figure 6B:
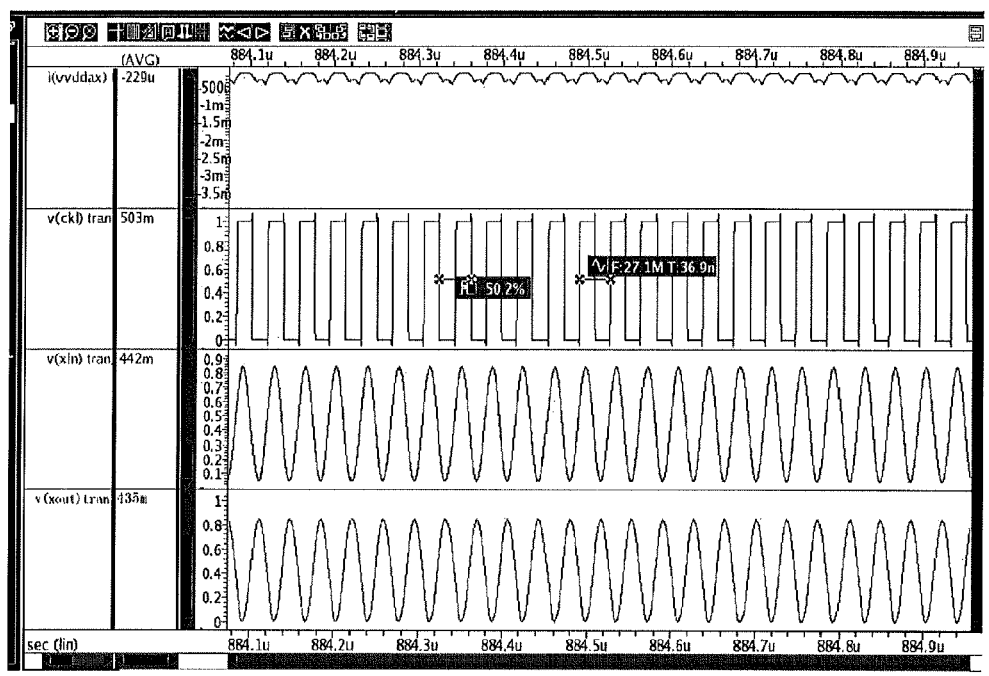

FIG. 6(a) and FIG. 6(b) illustrate simulation results of a crystal oscillator. It can be seen from FIG. 6(a) that, the oscillation current i is larger in the starting stage, which reaches 3.5 milliamperes, and current consumption in the stable stage is 500 microamperes (FIG. 6(b)). The output voltage V (ck1) of the self-adjuster is stable all the time. FIG. 6(b) is an enlarged view of a voltage current waveform near 800 microseconds of FIG. 6(a), and it can be seen from FIG. 6(b) that, the output voltage has uniform duty cycle and frequency, and the voltage jitter is very small.

The objectives, technical solutions, and beneficial effects of the present invention have been described in further detail through the above specific embodiments. It should be understood that the above descriptions are merely specific embodiments of the present invention, but not intended to limit the protection scope of the present invention. Any modification, equivalent replacement, or improvement made within the spirit and principle of the present invention should fall within the protection scope of the present invention.

What is claimed is:

1. A crystal oscillator circuit, comprising:
a power supply;
a crystal resonator circuit including an oscillator, generating an oscillation signal having a predetermined oscillation frequency;
an inverting amplification circuit, having an amplifier input end, a second control end and an inverting amplifier output end, the amplifier input end being coupled to the crystal resonator circuit and receiving the oscillation signal, wherein an inverting amplifier outputs an inverting amplified output signal;
a bias circuit, having a bias circuit input end and a bias circuit output end, wherein the bias circuit output end generates a bias circuit output signal controlled by the bias circuit input end, and the bias circuit output signal is coupled to the second control end of the inverting amplification circuit; and
a peak detection circuit configured to compare the oscillation signal from the amplifier input end with a reference signal, generate a compare signal based on the comparison, regulate the compare signal to generate a peak detector output signal, and feed the peak detector output signal into the bias circuit input end;
wherein the bias circuit comprises a self-adjusting circuit configured to regulate a voltage applied from the power supply to the second control end of the inverting amplifier.

2. The crystal oscillator circuit according to claim 1, wherein the peak detection circuit comprises a low pass filter consisting of a first resistor and a first capacitor.

3. The crystal oscillator circuit according to claim 1, wherein the inverting amplification circuit comprises a first NMOS transistor, a second PMOS transistor and a second resistor, wherein a gate of the first NMOS transistor, a gate of the second PMOS transistor and one end of the second resistor are connected to the amplifier input end of the inverting amplification circuit, a drain of the first NMOS transistor and a source of the second PMOS transistor are connected with the other end of the second resistor, a drain of the second PMOS transistor is connected to the second control end of the inverting amplifier; and a source of the first NMOS transistor is grounded.

4. The crystal oscillator circuit according to claim 3, wherein the second resistor comprises an NMOS transistor, the gate of the NMOS transistor forms a first control end of the inverting amplification circuit.

5. The crystal oscillator circuit according to claim 1, wherein the bias circuit comprises a twelfth NMOS transistor, a first current mirror and a second current mirror, a gate of the twelfth NMOS transistor is connected to the bias circuit input end, a drain of the twelfth NMOS transistor is connected to a first branch of the first current mirror, a second branch of the first current mirror is connected to a first branch of the second current mirror, and a second branch of the second current mirror is connected to the bias circuit output end.

6. The crystal oscillator circuit according to claim 5, wherein the first current mirror and/or the second current mirror comprises a transistor.

7. The crystal oscillator circuit according to claim 6, wherein the first branch of the second current mirror is a mirror image of a second branch of a second current mirror, thereby forming the self-adjusting circuit for isolating a power supply from the second input end of the inverting amplifier.

8. The crystal oscillator circuit according to claim 1, wherein the bias circuit comprises a narrow-band filter connected between the bias circuit input end and the bias circuit output end, for performing low pass filtering at a first frequency lower than an oscillator oscillation frequency; the bias circuit further comprises a frequency detector, for bypassing a switched capacitor filter when the oscillator frequency is not stable.

9. The crystal oscillator circuit according to claim 1, wherein the narrow-band filter is a switched capacitor filter.

10. The crystal oscillator circuit according to claim 8, comprising a low pass filter consisting of a third resistor and a third capacitor.

11. The crystal oscillator circuit according to claim 9, comprising a frequency divider, generating the first frequency lower than the oscillator oscillation frequency.

* * * * *